United States Patent
Lu et al.

(10) Patent No.: US 11,703,356 B1
(45) Date of Patent: Jul. 18, 2023

(54) ONLINE TRIMMING DEVICE AND METHOD FOR MICRO-SHELL RESONATOR GYROSCOPE

(71) Applicant: NATIONAL UNIVERSITY OF DEFENSE TECHNOLOGY, Changsha (CN)

(72) Inventors: Kun Lu, Changsha (CN); Dingbang Xiao, Changsha (CN); Yan Shi, Changsha (CN); Xuezhong Wu, Changsha (CN); Xiang Xi, Changsha (CN); Yongmeng Zhang, Changsha (CN)

(73) Assignee: NATIONAL UNIVERSITY OF DEFENSE TECHNOLOGY, Changsha (CN)

( * ) Notice: Subject to any disclaimer, the term of this patent is extended or adjusted under 35 U.S.C. 154(b) by 0 days.

(21) Appl. No.: 18/097,298

(22) Filed: Jan. 16, 2023

(30) Foreign Application Priority Data

Jun. 8, 2022 (CN) .......................... 202210641151.X (51) Int. Cl.
*G01C 19/56* (2012.01)
*G01C 25/00* (2006.01)
(Continued)

(52) U.S. Cl.
CPC ................ *G01C 25/00* (2013.01); *B81B 7/02* (2013.01); *B81C 1/00626* (2013.01);
(Continued)

(58) Field of Classification Search
CPC .... G01C 25/00; G01C 19/56; G01C 19/5691; B81B 7/02; B81B 2201/0242;
(Continued)

(56) References Cited

U.S. PATENT DOCUMENTS

| 4,644,793 A | * | 2/1987 | Church | ............. | G01C 19/5691 |
| | | | | | 73/504.13 |
| 10,266,398 B1 | * | 4/2019 | Kubena | ................. | C23C 16/403 |

(Continued)

FOREIGN PATENT DOCUMENTS

| CN | 108613686 A | 10/2018 |
| CN | 110702089 A | 1/2020 |

(Continued)

OTHER PUBLICATIONS

Zhenming Liu, et al., A Study of Mode-Matching and Alignment in Piezoelectric Disk Resonator Gyros via Femtosecond Laser Ablation, IEEE 34th International Conference on Micro Electro Mechanical Systems (MEMS) 2021 Virtual Conference, 2021, pp. 342-345.

(Continued)

*Primary Examiner* — David J Bolduc
(74) *Attorney, Agent, or Firm* — Bayramoglu Law Offices LLC (57) ABSTRACT

An online trimming device and method for a micro-shell resonator gyroscope is provided. A micro-shell resonator gyroscope fixing fixture and a mode test circuit in the device are placed in a vacuum test cavity provided with a circuit interface. The mode test circuit and a host computer are connected through a circuit interface on the vacuum test cavity. The gyroscope fixing fixture is provided with a signal interface, and the electrodes on the gyroscope substrate are connected to the signal interface. The signal interface on the fixture is connected to the mode test circuit. The laser etching module is located at the top of the device. An opening is formed in the gyroscope fixing fixture. The vacuum test cavity is provided with a transparent trimming window. The laser acts on the edge of the resonant structure of the gyroscope through the trimming window and the through hole of the fixture.

13 Claims, 5 Drawing Sheets

(51) Int. Cl.
*B81C 1/00* (2006.01)
*B81B 7/02* (2006.01)

(52) U.S. Cl.
CPC ...... *G01C 19/56* (2013.01); *B81B 2201/0242* (2013.01); *B81B 2201/0271* (2013.01); *B81C 2201/0143* (2013.01)

(58) Field of Classification Search
CPC ........ B81B 2201/0271; B81C 1/00626; B81C 2201/0143
See application file for complete search history.

(56) References Cited

U.S. PATENT DOCUMENTS

| | | | |
|---|---|---|---|
| 10,422,641 B1* | 9/2019 | Perahia | G01C 19/5691 |
| 2013/0104653 A1* | 5/2013 | Bernstein | G01C 19/5691 427/125 |
| 2014/0021561 A1* | 1/2014 | Trusov | B81B 3/0018 257/415 |
| 2014/0327439 A1 | 11/2014 | Cappellaro et al. | |
| 2016/0194200 A1* | 7/2016 | Najafi | C03B 23/0357 65/106 |
| 2017/0016742 A1* | 1/2017 | Shkel | G01C 25/00 |
| 2018/0188030 A1* | 7/2018 | Shang | B81C 1/00269 |
| 2018/0222748 A1* | 8/2018 | Hamelin | B81C 1/0065 |
| 2022/0049959 A1* | 2/2022 | Wu | G01C 19/5755 |
| 2022/0090917 A1* | 3/2022 | Najafi | G01C 19/5684 |

FOREIGN PATENT DOCUMENTS

| | | |
|---|---|---|
| CN | 111536994 A | 8/2020 |
| CN | 112393744 A | 2/2021 |
| CN | 113547223 A | 10/2021 |
| CN | 113551691 A | 10/2021 |
| JP | 2004085314 A | 3/2004 |
| JP | 2013205027 A | 10/2013 |
| WO | 2005015127 A2 | 2/2005 |

OTHER PUBLICATIONS

J J Bernstein, et al., A MEMS diamond hemispherical resonator, Journal of Micromechanics and Microengineering, 2013, pp. 1-8, vol. 23, 125007.

Kun Lu, et al., Research on precise mechanical trimming of a micro shell resonator with T-shape masses using femtosecond laser ablation, Sensors and Actuators A: Physical, 2019, pp. 228-238, vol. 290.

Zhang Yongmeng, et al., Research on Damping ErrorTuning and Compensating Technology of Whole Angle Mode Hemispherical Resonator Gyroscope, Journal of Mechanical Engineering, 2022, pp. 145-152, vol. 58, No. 16.

\* cited by examiner

ONLINE TRIMMING DEVICE AND METHOD FOR MICRO-SHELL RESONATOR GYROSCOPE

CROSS REFERENCE TO THE RELATED APPLICATIONS

This application is based upon and claims priority to Chinese Patent Application No. 202210641151.X, filed on Jun. 8, 2022, the entire contents of which are incorporated herein by reference.

TECHNICAL FIELD

The present invention relates to the technical field of micro-electromechanical system (MEMS) manufacturing, and more particularly, to an online trimming device and method for a micro-shell resonator gyroscope.

BACKGROUND

The gyroscope is one of the core components of the inertial navigation system and is used to measure the angular velocity or other angle information of the carrier platform relative to the inertial space. The performance of the gyroscope directly determines the theoretical upper limit of the positioning accuracy of the inertial navigation system. A micro-shell resonator gyroscope is composed of an electrode substrate and a curved-surface resonant structure, which is developed based on the traditional macroscopic hemispherical resonator gyroscope (HRG). The micro-shell resonator gyroscope can be manufactured based on high quality factor materials such as fused silica. Due to a low internal damping loss, it is easy to achieve a high quality factor, resulting in the micro-shell resonator gyroscope having the greatest potential among the micro-electromechanical gyroscopes.

A micro-shell resonator gyroscope is essentially a kind of solid-state wave gyroscope, which realizes angle or angular velocity measurement based on the Coriolis force effect. According to different control modes, the micro-shell resonator gyroscope can be operated in a rate mode to output angular velocity information and a rate-integration mode to output angle information directly. However, under the two control modes, the gyroscope operates in a "wine glass" shaped mode of n=2, including the driving mode and detection mode which have two orthogonal vibration axes.

In ideal conditions, the frequency of the driving mode of the gyroscope is equal to the frequency of the detection mode of the gyroscope. Due to the existence of manufacturing error, the frequencies of the two modes of a manufactured gyroscope are inconsistent, and the frequency difference between the two modes is called a frequency split. When the micro-shell resonator gyroscope is operating, the frequency split will significantly reduce the sensitivity of the gyroscope, thus restricting the improvement in the performance of the gyroscope. Therefore, the method of frequency trimming must be adopted to restrain the frequency split of the manufactured micro-shell resonator gyroscope.

Since the size of the micro-shell resonator gyroscope is significantly smaller than traditional hemispherical gyroscopes, the relative manufacturing error of the micro-shell resonator gyroscope is large, and the frequency split caused by the structural asymmetry is large. At present, frequency trimming methods mainly include mechanical trimming and electrostatic trimming. Electrostatic trimming applies bias voltage in the direction of high-frequency mode to reduce the local equivalent stiffness to realize frequency matching. In this method, a complex closed-loop frequency modulation algorithm is adopted, and high voltage is required to perform the trimming when the frequency split of the gyroscope is large. Mechanical trimming achieves permanent frequency trimming by etching a mass on the structural surface of the gyroscope, which is an important method to restrain the frequency split of the micro-shell resonator gyroscope.

In 2013, Draper laboratory adopted a mechanical trimming method to successfully reduce the frequency split of the micro-shell resonator gyroscope to 0.35 Hz (J. J. Bernstein, M. G. Bancu, E. H. Cook, M. V. Chaparala, W. A. Teynor, M. S. Weinberg. *A MEMS diamond hemispherical resonator*[J]. J. Micromech. Microeng., 2013, 23(12): 125007). In 2019, the University of Defense Science and Technology adopted a mechanical trimming method to reduce the frequency split of the micro-shell resonator gyroscope to about 0.1 Hz (Lu K, Xi X, Li W, et al. *Research on Precise Mechanical trimming of a Micro Shell Resonator with T-shape Masses Using Femtosecond Laser Ablation*[J]. Sensors and Actuators A Physical, 2019, 290:228-238).

In the process of mechanical trimming in the prior art, a laser vibrometer or a frequency sweep circuit is adopted to determine the frequency and mode axis of the operating mode, and a laser etching system is then employed to perform a mass etching. In this process, the trimming efficiency is low. Environmental changes and other factors in the transporting process of the gyroscope will also restrict the trimming accuracy.

SUMMARY

Given the shortcomings in the prior art, the present invention provides an online trimming device and method for a micro-shell resonator gyroscope, which controls the removal quality in the process of trimming, simultaneously tests the frequency of the gyroscope online, and evaluates the trimming effect in real-time, thereby improving the trimming efficiency and accuracy of the gyroscope.

To achieve the above objective, the present invention provides an online trimming device for a micro-shell resonator gyroscope. The micro-shell resonator gyroscope includes a gyroscope substrate, a resonant structure, and a plurality of gyroscope electrodes, where the resonant structure and the plurality of gyroscope electrodes are arranged on the gyroscope substrate.

The online trimming device includes a housing, a gyroscope fixing fixture, a mode test circuit module, and a laser etching module.

The interior of the housing is provided with a vacuum test cavity, and the top of the housing is provided with a trimming window. The housing is further provided with a circuit interface.

The gyroscope fixing fixture is arranged in the vacuum test cavity, and the top of the gyroscope fixing fixture has an opening. The micro-shell resonator gyroscope is fixedly arranged in the gyroscope fixing fixture. The resonant structure is located in the opening, and the opening is located directly below the trimming window.

The mode test circuit module is arranged in the vacuum test cavity. The gyroscope fixing fixture is provided with a signal interface electrically connected to the gyroscope electrodes. The signal interface is electrically connected to the circuit interface through the mode test circuit module.

The laser etching module is arranged above the housing, and the laser output end of the laser etching module faces the trimming window.

In an embodiment, the gyroscope fixing fixture includes a base and a cover assembly.

The base is fixedly arranged in the vacuum test cavity, and the top of the base is provided with a limiting slot configured for receiving the gyroscope substrate.

The cover assembly fixedly covers the base and the top of the gyroscope substrate. The cover plate assembly is provided with a plurality of conducting columns in one-to-one correspondence with the gyroscope electrodes, and the bottom ends of the conducting columns are correspondingly connected to the gyroscope electrodes.

The signal interface is arranged on the cover plate assembly and is electrically connected to each of the conducting columns.

In an embodiment, the cover assembly includes a conducting plate and a signal connection plate.

The conducting plate is provided with a first through hole, and the conducting plate covers the base and the top of the gyroscope substrate. The conducting plate is sleeved at an interval on the resonant structure through the first through hole. Each of the conducting columns is arranged on the conducting plate.

The signal connection plate is provided with a second through hole and a plurality of bonding pads in one-to-one correspondence with the conducting columns. The signal connection plate covers the top of the conducting plate. The signal connection plate is sleeved at an interval on the resonant structure through the second through hole. The bonding pads are correspondingly connected to the top ends of the conducting columns.

The signal interface is arranged on the signal connection board and is electrically connected to each of the bonding pads through wires inside the signal connection board.

In an embodiment, the mode test circuit module includes a signal processing circuit board, a signal input interface, and a signal exchange interface, where the signal input interface and the signal exchange interface are arranged on the signal processing circuit board. The signal input interface and the signal exchange interface are communicated with the interior of the signal processing circuit board.

The signal input interface is electrically connected to the signal interface through a first connection line to realize the communication between the gyroscope electrodes and the signal processing circuit board.

The signal exchange interface is electrically connected to the circuit interface through a second connection line to realize the external power supply for the mode test circuit module and the interaction of the mode test circuit module with a host computer.

In an embodiment, the housing includes a bottom cover and a top cover.

The top cover is detachably fixed to the bottom cover, and the top cover and the bottom cover define the vacuum test cavity. A side of the bottom cover is provided with an air outlet communicated with the vacuum test cavity to connect an external evacuating device.

The trimming window is arranged at the top cover, and the circuit interface is arranged on a side of the bottom cover.

To achieve the above objective, the present invention further provides an online trimming method for a micro-shell resonator gyroscope, which employs the aforementioned online trimming device. The online trimming method includes the following steps:

Step 1: fixing the micro-shell resonator gyroscope on the gyroscope fixing fixture and allowing the gyroscope fixing fixture to be placed in the vacuum test cavity and located directly below the trimming window.

Step 2: placing the mode test circuit module in the vacuum test cavity; communicating a signal exchange interface of the mode test circuit module with the circuit interface, and communicating the signal input interface of the mode test circuit module with the signal interface; evacuating the vacuum test cavity, and turning on an external power source and software of a host computer to start an operation of the mode test circuit module.

Step 3: testing a frequency distribution and an initial frequency split $df_1$ of the micro-shell resonator gyroscope in a circumferential direction.

Step 4: calculating a trimming position and an initial trimming quality $dm_1$, determining the diameter and depth of a trimming hole, and employing the laser etching module to laser-etch the trimming hole.

Step 5: testing the frequency distribution and the frequency split $df_2$ of the micro-shell resonator gyroscope in the circumferential direction after laser etching, and obtaining the next trimming quality according to a linear relationship between the initial trimming quality and the frequency split change amount in the previous step, which is:

$$dm_2 = \frac{df_2}{df_1 - df_2} \cdot dm_1,$$

then, determining the diameter and the depth of the trimming hole, and employing the laser etching module to laser-etch the trimming hole.

Step 6: repeating steps 4 and 5 until the frequency split of the micro-shell resonator gyroscope meets a selected requirement.

In an embodiment, in step 3, a test process for the frequency distribution and the frequency split includes:

Step 3.1: applying an alternating voltage on two pairs of orthogonal driving electrodes and detection electrodes of the gyroscope to allow the gyroscope to resonate in an operating mode of n=2; adjusting the voltage ratio on the electrodes to change the direction of a driving resultant force applied on the micro-shell resonator gyroscope so that the gyroscope is subject to resonation mode precession.

Step 3.2: selecting a plurality of orientation points distributed uniformly during the resonation mode precession to extract operating frequency information of the gyroscope.

Step 3.3: based on frequencies of different orientation points, fitting frequency distribution information of the gyroscope in the circumferential direction according to a law of sinusoidal distribution. The difference between the maximal value $f_{max}$ and the minimal value $f_{min}$ of the frequencies defines the frequency split.

In an embodiment, a specific process of step 4 includes:

Step 4.1: the trimming position including four uniformly distributed orientation points corresponding to the minimal value of the fitted frequencies, and selecting an edge position of the micro-shell resonator gyroscope corresponding to the above orientation points;

Step 4.2: calculating the initial trimming quality, which is:

$$dm_1 = 1/4 \frac{2df_1}{f_{max} + f_{min}} \cdot M_0,$$

where $M_0$ is an equivalent mass of the gyroscope.

Step 4.3: according to the density and the trimming quality of the micro-shell resonator gyroscope, selecting the diameter of the trimming hole and calculating a trimming depth, and then etching the trimming hole by laser.

The present invention provides an online trimming device and method for a micro-shell resonator gyroscope. Compared with the frequency trimming solution for the micro-shell resonator gyroscope by using the femtosecond laser technology, the present invention can test the mode frequency online, evaluate the trimming effect, and correct the trimming parameter in real-time, which significantly improves the trimming accuracy and efficiency. Moreover, according to the present invention, the vacuum environment is established in the trimming process, and the measurement and control circuit module is employed to evaluate the mode frequency of the gyroscope, which reduces the large volume required by the laser vibrometer and is beneficial for miniaturized integration.

BRIEF DESCRIPTION OF THE DRAWINGS

To clearly illustrate the technical solutions in the embodiments of the present invention or the prior art, the drawings used in the description of the embodiments or the prior art are briefly introduced below. The drawings described below are only some embodiments of the present invention. For those having ordinary skill in the art without applying inventive effort, other drawings may also be obtained according to the structures shown in these drawings.

REFERENCING NUMERALS OF THE FIGURES housing 1: air outlet 11, circuit interface 12, trimming window 13, top cover 14, bottom cover 15, vacuum test cavity 16;

gyroscope fixing fixture 2: base 21, limiting slot 211, first snap-fit structure 212, conducting plate 22, fixed plate 221, conducting column 222, first through hole 223, threaded hole 224, second snap-fit structure 225, signal connection plate 23, bonding pad 231, signal interface 232, second through hole 233, third through hole 234, screw 24;

mode test circuit module 3: signal input interface 31, signal processing circuit board 32, signal exchange interface 33;

laser etching module 4;

first connection line 5;

second connection line 6; and micro-shell resonator gyroscope 7: gyroscope electrode 71, driving electrode 711, detection electrode 712, gyroscope substrate 72, resonant structure 73.

The realization, functional features, and advantages of the present invention will be further explained in the embodiments with references to the drawings.

DETAILED DESCRIPTION OF THE EMBODIMENTS

The technical solutions in the embodiments of the present invention are described clearly and completely below in conjunction with the drawings in the embodiments of the present invention. The described embodiments are only part of the embodiments of the present invention, not all embodiments. Based on the embodiments of the present invention, all other embodiments obtained by those having ordinary skill in the art without inventive effort shall fall within the scope of protection of the present invention.

It should be noted that all directional instructions in the embodiments of the present invention, such as top, bottom, left, right, front, back, etc., are only configured to explain the relative position relationships, motion, and other situations between the components under a particular positioning (as shown in the drawings). If the particular positioning changes, the directional indication changes accordingly.

In addition, the descriptions related to "first", "second", and the like in the present invention are used only for descriptive purposes and cannot be understood as indicating or implying their relative importance or implicitly indicating the number of indicated technical features. Thus, a feature defined as "first" and "second" may include at least one of the features either expressly or implicitly. In the description of the present invention, "a plurality of" means at least two, such as two, three, etc., unless otherwise clearly and specifically defined.

In the present invention, unless otherwise clearly specified and defined, the terms "connection" and "fixed" should be understood in a broad sense. For example, "fixed" may be a fixed connection, a detachable connection, or to form an integral whole; it may be a mechanical connection, an electrical connection, a physical connection or a wireless communication connection; it may be a direct connection, an indirect connection through an intermediate medium, an internal connection of two elements, or an interaction of two elements, unless otherwise clearly defined. For those having ordinary skill in the art, the specific meaning of the above terms in the present invention may be understood according to the specific circumstances.

In addition, the technical solutions of the various embodiments of the present invention may be combined, which must be based on the realization of those having ordinary skill in the art. When the combination of technical solutions occurs in contradiction or cannot be realized, it should be considered that such a combination of the technical solutions does not exist and does not fall within the scope of protection of the present invention.

Figure 1:
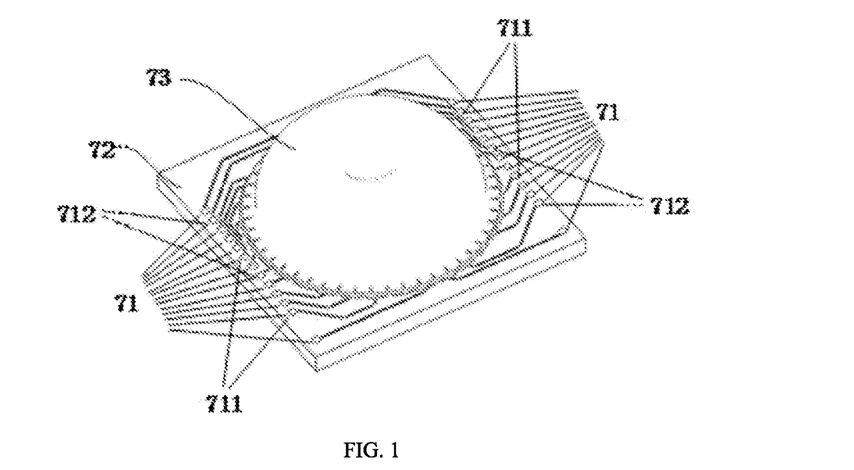
FIG. 1 is a schematic diagram of the structure of a micro-shell resonator gyroscope according to an embodiment of the present invention.

Referring to FIG. 1, the micro-shell resonator gyroscope 7 includes the gyroscope substrate 72, the resonant structure 73, and a plurality of gyroscope electrodes 71, where the resonant structure 73 and the plurality of gyroscope electrodes 71 are arranged on the gyroscope substrate 72. The gyroscope electrodes 71 include the driving electrodes 711 and the detection electrodes 712, which are distributed at positions corresponding to two sides of the resonant structure 73 on the gyroscope substrate 72 and are electrically connected to the resonant structure 73.

Embodiment 1

Figure 2:
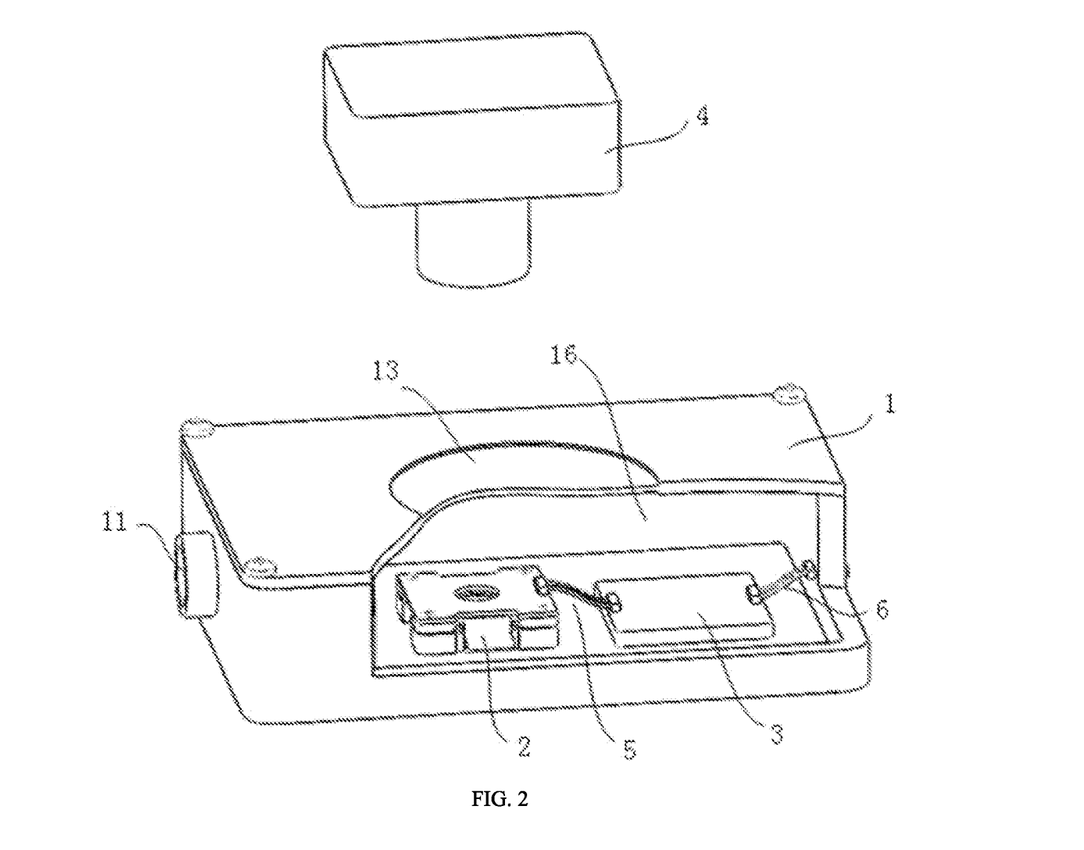
FIG. 2 is an axonometric diagram of a trimming device according to an embodiment of the present invention.

Based on the structure of the micro-shell resonator gyroscope 7, this embodiment discloses an online trimming device for a micro-shell resonator gyroscope. Referring to FIG. 2, the online trimming device includes the housing 1, the gyroscope fixing fixture 2, the mode test circuit module 3, and the laser etching module 4. Specifically, the housing 1 is configured to provide the vacuum environment for a gyroscope mode test, and the gyroscope fixing fixture 2 is configured for receiving and fixing a gyroscope to be trimmed. The mode test circuit module 3 is configured to realize an interaction between the gyroscope and the software of a host computer, and the laser etching module 4 is configured to realize the quality etching and trimming of the gyroscope.

Figure 3:
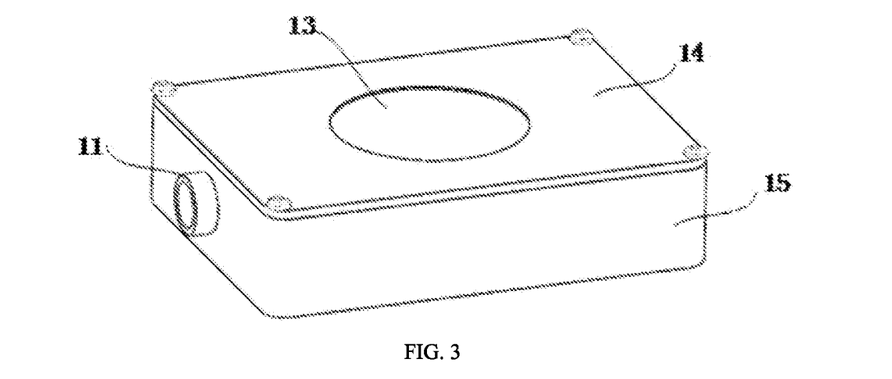
FIG. 3 is a first axonometric diagram of a housing according to an embodiment of the present invention.
Figure 4:
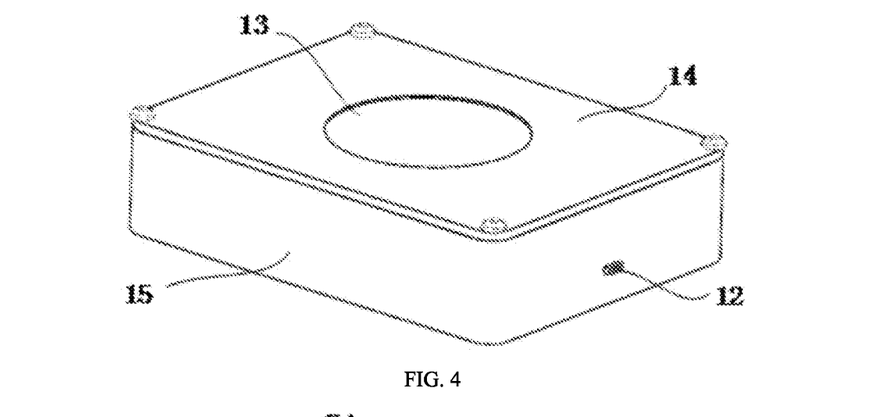
FIG. 4 is a second axonometric diagram of the housing according to an embodiment of the present invention.

Referring to FIGS. 2-4, the interior of the housing 1 is provided with the vacuum test cavity 16, and the top of the housing 1 is provided with the trimming window 13. The housing 1 is further provided with the circuit interface 12 for connecting an external power source to supply power to the mode test circuit module 3. Moreover, the mode test circuit module 3 and the host computer are connected through the circuit interface 12 on the housing 1 to calculate a mode frequency and a trimming parameter of the gyroscope. Specifically, the trimming window 13 is a glass window. In the specific implementation process, the housing 1 includes the bottom cover 15 and the top cover 14. The top cover 14 is detachably fixed to the top of the bottom cover 15 by screws, and the vacuum test cavity 16 is formed between the top cover 14 and the bottom cover 15. A side of the bottom cover 15 is provided with the air outlet 11 communicated with the vacuum test cavity 16 to connect the external evacuating device so that the vacuum test cavity 16 is evacuated. The trimming window 13 is arranged at the top cover 14, and the circuit interface 12 is arranged on a side of the bottom cover 15.

Referring to FIG. 2, the gyroscope fixing fixture 2 is arranged in the vacuum test cavity 16, and the top of the gyroscope fixing fixture 2 has an opening. The micro-shell resonator gyroscope 7 is fixedly arranged in the gyroscope fixing fixture 2. The resonant structure 73 is located in the opening, and the opening is located directly below the trimming window 13.

Figure 5:
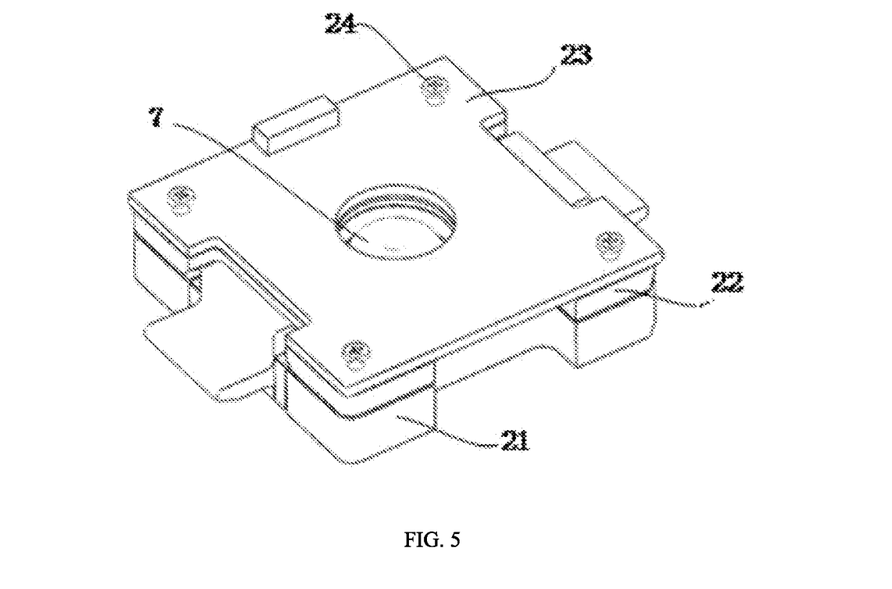
FIG. 5 is an axonometric diagram of a gyroscope fixing fixture according to an embodiment of the present invention.
Figure 6:
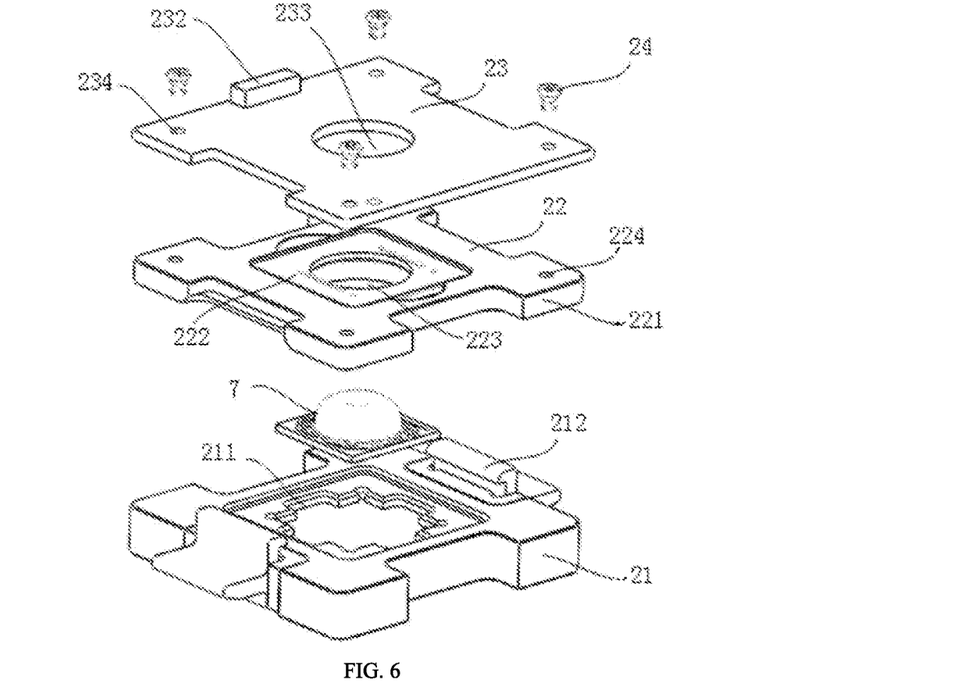
FIG. 6 is an exploded diagram of the gyroscope fixing fixture according to an embodiment of the present invention.

Referring to FIGS. 5 and 6, the gyroscope fixing fixture 2 includes the base 21 and a cover assembly. The cover assembly includes the conducting plate 22 and the signal connection plate 23 and is configured for receiving and fixing the micro-shell resonator gyroscope 7 to be trimmed.

Figure 7:
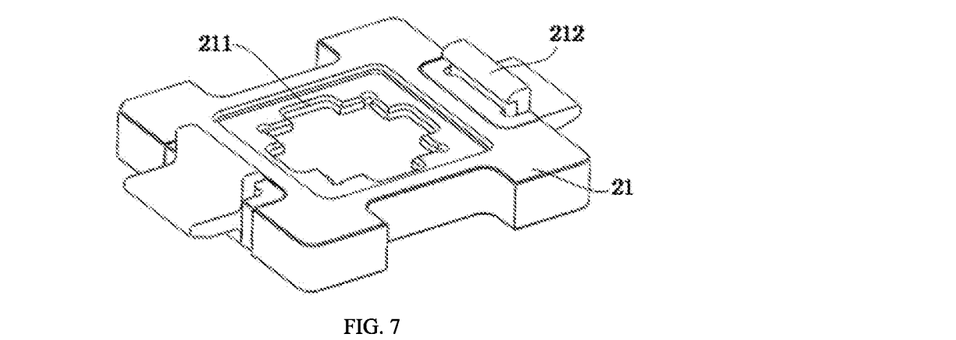
FIG. 7 is an axonometric diagram of a base according to an embodiment of the present invention.

Referring to FIG. 7, the base 21 is fixedly arranged in the vacuum test cavity 16, and the top of the base 21 is provided with the first snap-fit structure 212 and the limiting slot 211 configured for receiving the gyroscope substrate 72. In the preparation process of trimming, the gyroscope substrate 72 is placed in the limiting slot 211, and the edge of the gyroscope substrate 72 maintains a clearance fit with the side wall of the limiting slot 211.

Figure 8:
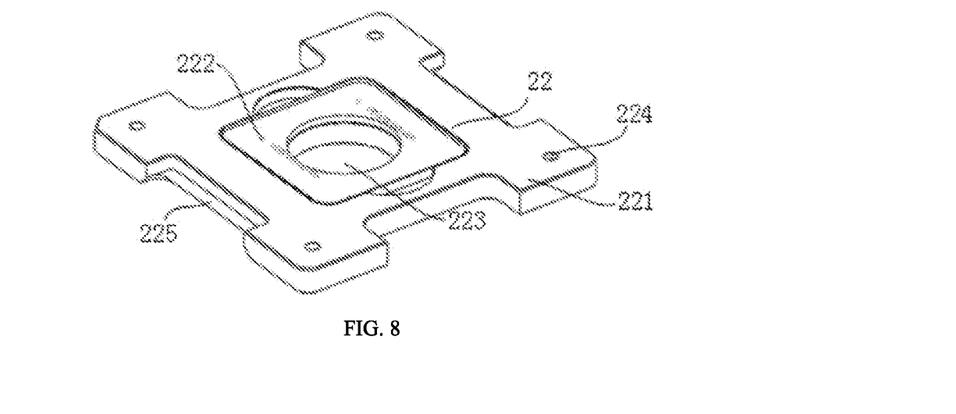
FIG. 8 is a first axonometric diagram of a conducting plate according to an embodiment of the present invention.
Figure 9:
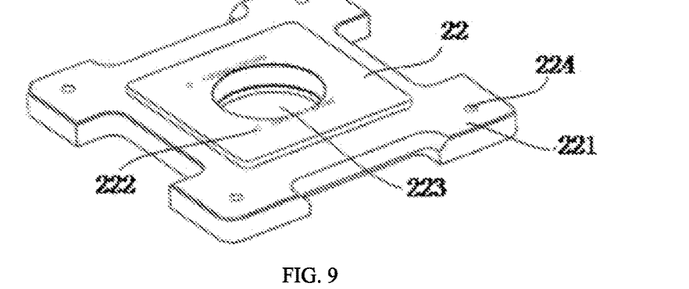
FIG. 9 is a second axonometric diagram of the conducting plate according to an embodiment of the present invention.

Referring to FIGS. 8 and 9, the conducting plate 22 mainly includes the fixed plate 221, the conducting columns 222, the first through hole 223, and the threaded holes 224, where the conducting columns 222, the first through hole 223, and the threaded holes 224 are arranged at the fixed plate 221. A plurality of conducting columns 222 are arranged in one-to-one correspondence with the gyroscope electrodes 71. The symmetrical center of the first through hole 223 coincides with the symmetrical center of the limiting slot 211, and the diameter of the first through hole 223 is greater than the maximum diameter of the resonant structure 73 of the gyroscope. The conducting plate 22 is further provided with the second snap-fit structure 225 matched with the first snap-fit structure 212. The conducting plate 22 covers the base 21 and the top of the gyroscope substrate 72 through the snap-fit cooperation of the first snap-fit structure 212 and the second snap-fit structure. Meanwhile, the lower part of the resonant structure 73 is located in the first through hole 223, and the bottom ends of the conducting columns 222 are correspondingly connected to the gyroscope electrodes 71. In the specific implementation process, the first snap-fit structure 212 may employ clamping slots arranged on both sides of the top of the base 21, and the second snap-fit structure 225 may employ clamping blocks arranged on both sides of the conducting plate 22 and corresponding to the clamping slots. During a connection, the clamping blocks are inserted into the clamping slots.

Figure 10:
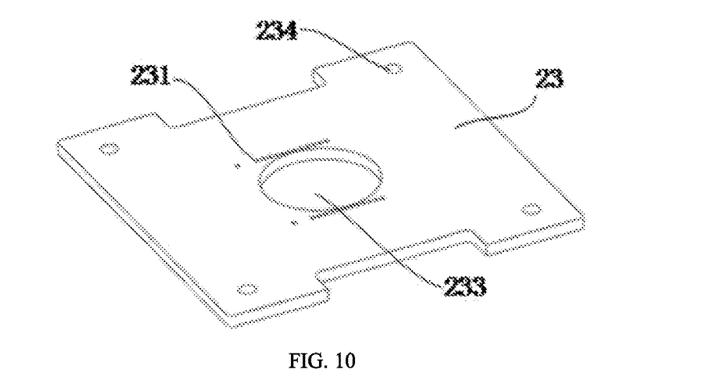
FIG. 10 is a first axonometric diagram of a signal connection board according to an embodiment of the present invention.
Figure 11:
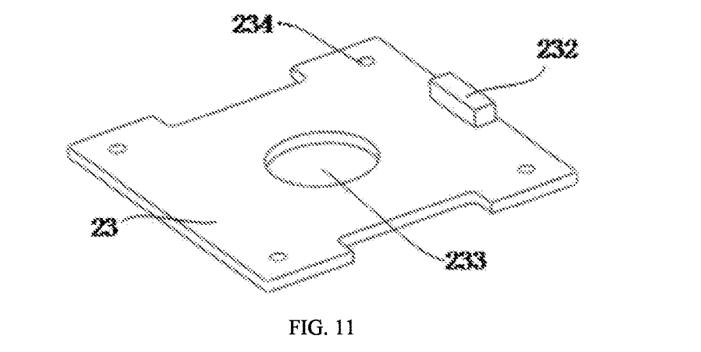
FIG. 11 is a second axonometric diagram of the signal connection board according to an embodiment of the present invention.

Referring to FIGS. 10 and 11, the signal connection plate 23 is provided with the bonding pads 231, the signal interface 232, the second through hole 233, and the third through holes 234. A plurality of bonding pads 231 are arranged in one-to-one correspondence with the conducting columns 222. The symmetrical center of the second through hole 233 coincides with the symmetrical center of the first through hole 223 and the symmetrical center of the limiting slot 211, and the diameter of the second through hole 233 is greater than the maximum diameter of the resonant structure 73 of the gyroscope. The third through holes 234 are in one-to-one correspondence with the threaded holes 224. The conducting plate 22 is fixedly connected to the signal connection plate 23 by the screws 24. When the signal connection plate 23 covers the top of the conducting plate 22, the bonding pads 231 are correspondingly connected to the top ends of the conducting columns 222. Meanwhile, the upper part of the resonant structure 73 is located in the second through hole 233, that is, the first through hole 223 and the second through hole 233 together form the opening at the top of the gyroscope fixing fixture 2. The signal interface 232 is arranged on the signal connection board 23 and is electrically connected to each of the bonding pads 231 through the wires inside the signal connection board 23 to realize the communication between the signal interface 232 and the gyroscope electrodes 71.

Figure 12:
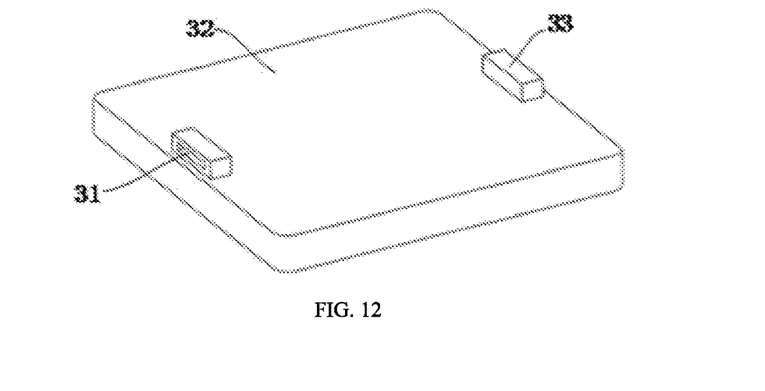
FIG. 12 is an axonometric diagram of a mode test circuit module according to an embodiment of the present invention.

Referring to FIGS. 2 and 12, the mode test circuit module 3 is arranged in the vacuum test cavity 16, and the signal interface 232 is electrically connected to the circuit interface 12 through the mode test circuit module 3. Specifically, the mode test circuit module 3 includes the signal processing circuit board 32, the signal input interface 31, and the signal exchange interface 33, where the signal input interface 31 and the signal exchange interface 33 are arranged on the signal processing circuit board 32. The signal input interface 31 and the signal exchange interface 33 are communicated with the interior of the signal processing circuit board 32. The signal input interface 31 is electrically connected to the signal interface 232 through the first connection line 5 to realize the communication between the gyroscope electrodes 71 and the signal processing circuit board 32. The signal exchange interface 33 is electrically connected to the circuit interface 12 through the second connection line 6 to realize the external power supply for the mode test circuit module 3 and the interaction of the mode test circuit module 3 with the host computer.

Referring to FIG. 2, the laser etching module 4 is a laser generator arranged above the housing 1, and the laser output end of the laser etching module 4 faces the trimming window 13 to realize the quality etching and trimming of the gyroscope. Specifically, the gyroscope fixing fixture 2 and the mode test circuit module 3 are first smoothly placed in the vacuum test cavity 16, and the laser etching module 4 is located above the vacuum test cavity 16. The laser can pass through the trimming window 13, the first through hole 223, and the second through hole 233 to etch the edge of the resonant structure 73 of the gyroscope to realize quality etching and trimming.

Embodiment 2

Figure 13:
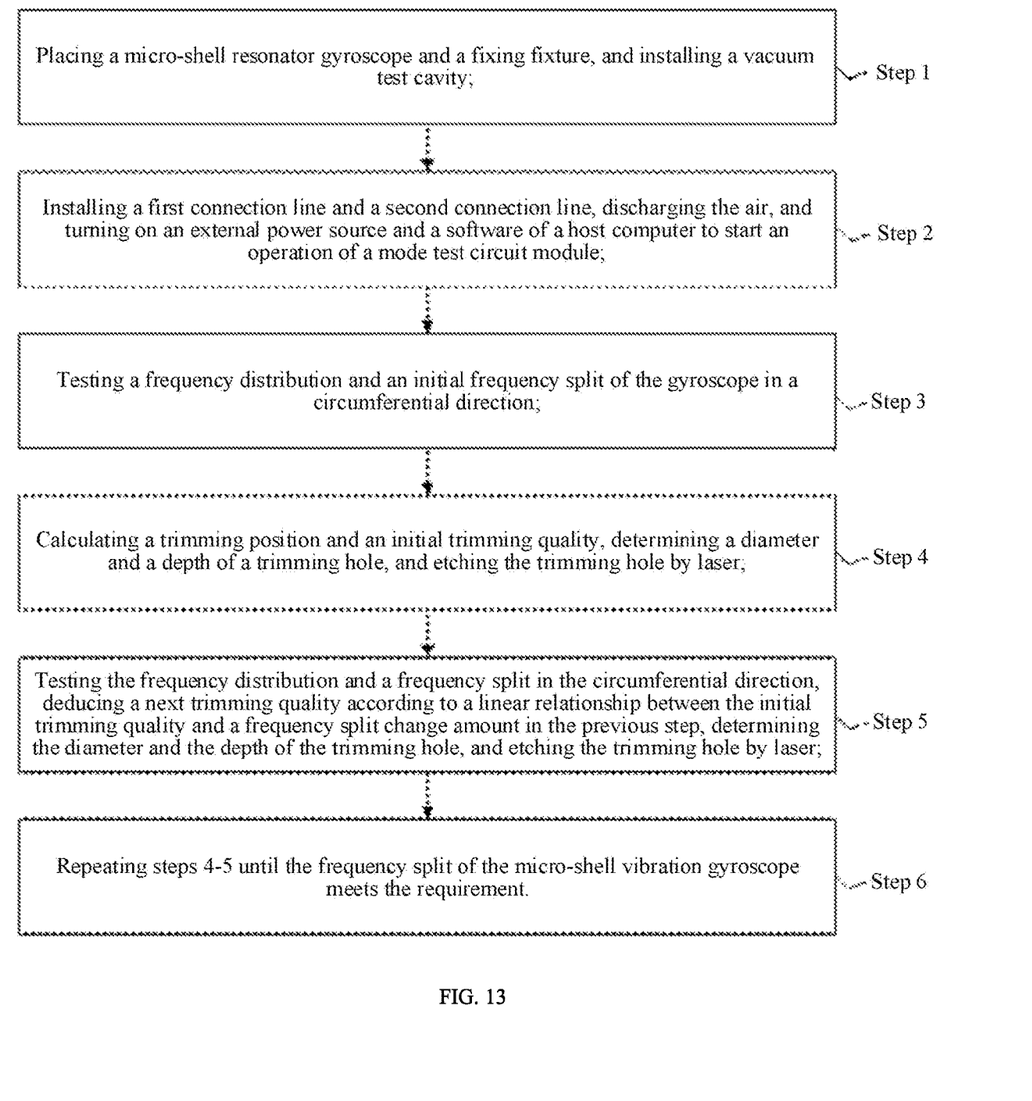
FIG. 13 is a flow diagram of an online laser trimming method according to an embodiment of the present invention.

This embodiment discloses an online trimming method for a micro-shell resonator gyroscope, which employs the online trimming device of Embodiment 1. Referring to FIG. 13, the online trimming method includes the following steps:

Step 1: placing the micro-shell resonator gyroscope 7 in the limiting slot 211 of the base 21 and integrally fastening the gyroscope fixing fixture 2 by the snap-fit structures and the screws 24 in the vacuum test cavity 16 directly below the trimming window 13.

Step 2: placing the mode test circuit module 3 in the vacuum test cavity 16, installing the first connection line 5 to communicate the signal interface 232 with the signal input interface 31, installing the second connection line 6 to communicate the signal exchange interface 33 with the circuit interface 12, turning on the external power source and the software of the host computer, and after evacuating the vacuum test cavity 16, turning on the external power source and the software of the host computer to start an operation of the mode test circuit module 3.

Step 3: testing the frequency distribution and initial frequency split $df_1$ of the micro-shell resonator gyroscope 7 in the circumferential direction, and the specific implementation process is as follows:

Step 3.1: applying an alternating voltage on two pairs of orthogonal driving electrodes 711 and detection electrodes 712 of the gyroscope to allow the gyroscope to resonate in the operating mode of n=2 and adjusting the voltage ratio on the gyroscope electrodes 71 to change the direction of the driving resultant force applied on the micro-shell resonator gyroscope 7 so that the gyroscope is subject to resonation mode precession.

Step 3.2: selecting a plurality of orientation points distributed uniformly during the resonation mode precession to extract operating frequency information of the gyroscope.

Step 3.3: based on frequencies of different orientation points, fitting the frequency distribution information of the gyroscope in the circumferential direction according to a law of sinusoidal distribution, where the difference between the maximal value $f_{max}$ and the minimal value Ain of the frequencies defines the frequency split.

Step 4: calculating the trimming position and the initial trimming quality $dm_1$, determining the diameter and the depth of the trimming hole, and employing the laser etching module 4 to laser-etch the trimming hole. The specific implementation process is as follows:

Step 4.1: the trimming position including four uniformly distributed orientation points corresponding to the minimal value of the fitted frequencies, and selecting the edge position of the micro-shell resonator gyroscope 7 corresponding to the above orientation points.

Step 4.2: calculating the initial trimming quality according to the empirical formula, which is:

$$dm_1 = 1/4 \frac{2df_1}{f_{max} + f_{min}} \cdot M_0,$$

where $M_0$ is the equivalent mass of the gyroscope.

Step 4.3: according to the density and the trimming quality of the micro-shell resonator gyroscope 7, selecting the diameter of the trimming hole, calculating the trimming depth, and then etching the trimming hole by laser.

Step 5: testing the frequency distribution and the frequency split $df_2$ of the micro-shell resonator gyroscope 7 in the circumferential direction after the laser etching and obtaining the next trimming quality according to a linear relationship between the initial trimming quality and the frequency split change amount in the previous step, which is:

$$dm_2 = \frac{df_2}{df_1 - df_2} \cdot dm_1,$$

then, determining the diameter and the depth of the trimming hole, and employing the laser etching module 4 to laser-etch the trimming hole.

Step 6: repeating steps 4 and 5 until the frequency split of the micro-shell resonator gyroscope 7 meets a selected requirement.

Compared with the frequency trimming solution for the micro-shell resonator gyroscope 7 by using the femtosecond laser technology, the method of the present invention can test the mode frequency online, evaluate the trimming effect, and correct the trimming parameter in real-time, which significantly improves the trimming accuracy and efficiency. Moreover, the vacuum environment is established in the trimming process, and the measurement and control circuit module is employed to evaluate the mode frequency of the gyroscope, which reduces the large volume required by the laser vibrometer and is beneficial for miniaturized integration.

The above only describes the preferred embodiments of the present invention and therefore does not limit the scope of protection of the present invention. Under the conception of the present invention, the equivalent structural variation made by using the contents of the description and the drawings of the present invention or direct/indirect application in other related technical fields shall fall within the protection scope of the present invention.

What is claimed is:

1. An online trimming method for a micro-shell resonator gyroscope, wherein the micro-shell resonator gyroscope comprises a gyroscope substrate, a resonant structure, and a plurality of gyroscope electrodes, wherein the resonant structure and the plurality of gyroscope electrodes are arranged on the gyroscope substrate; an online trimming device is employed to perform an online trimming, and the online trimming device comprises a housing, a gyroscope fixing fixture, a mode test circuit module, and a laser etching module;

an interior of the housing is provided with a vacuum test cavity, a top of the housing is provided with a trimming window, and the housing is further provided with a circuit interface;

the gyroscope fixing fixture is arranged in the vacuum test cavity, and a top of the gyroscope fixing fixture has an opening; the micro-shell resonator gyroscope is fixedly arranged in the gyroscope fixing fixture; the resonant structure is located in the opening, and the opening is located directly below the trimming window;

the mode test circuit module is arranged in the vacuum test cavity; the gyroscope fixing fixture is provided with a signal interface electrically connected to the gyroscope electrodes;

the signal interface is electrically connected to the circuit interface through the mode test circuit module; and the laser etching module is arranged above the housing, and a laser output end of the laser etching module faces the trimming window;

wherein the online trimming method comprises the following steps:

step 1: fixing the micro-shell resonator gyroscope on the gyroscope fixing fixture and allowing the gyroscope fixing fixture to be placed in the vacuum test cavity and located directly below the trimming window;

step 2: placing the mode test circuit module in the vacuum test cavity; communicating a signal exchange interface of the mode test circuit module with the circuit interface, and communicating a signal input interface of the mode test circuit module with the signal interface; evacuating the vacuum test cavity, and turning on an external power source and software of a host computer to start an operation of the mode test circuit module;

step 3: testing a frequency distribution and an initial frequency split $df_1$ of the micro-shell resonator gyroscope in a circumferential direction;

step 4: calculating a trimming position and an initial trimming quality $dm_1$, determining a diameter and a depth of a trimming hole, and employing the laser etching module to laser-etch the trimming hole;

step 5: testing the frequency distribution and a frequency split $df_2$ of the micro-shell resonator gyroscope in the circumferential direction after laser etching, and obtaining a next trimming quality according to a linear relationship between the initial trimming quality and a frequency split change amount in the previous step, which is:

$$dm_2 = \frac{df_2}{df_1 - df_2} \cdot dm_1,$$

then, determining the diameter and the depth of the trimming hole, and employing the laser etching module to laser-etch the trimming hole; and step 6: repeating steps 4 and 5 until the frequency split of the micro-shell resonator gyroscope meets a selected requirement.

2. The online trimming method for the micro-shell resonator gyroscope according to claim 1, wherein in step 3, a test process for the frequency distribution and the frequency split comprises:

step 3.1: applying an alternating voltage on two pairs of orthogonal driving electrodes and detection electrodes of the gyroscope to allow the gyroscope to resonate in an operating mode of n=2; adjusting a voltage ratio on the electrodes to change a direction of a driving resultant force applied on the micro-shell resonator gyroscope so that the gyroscope is subject to resonation mode precession;

step 3.2: selecting a plurality of orientation points distributed uniformly during the resonation mode precession to extract operating frequency information of the gyroscope; and step 3.3: based on frequencies of different orientation points, fitting frequency distribution information of the gyroscope in the circumferential direction according to a law of sinusoidal distribution, wherein a difference between a maximal value $f_{max}$ and a minimal value $f_{min}$ of the frequencies defines the frequency split.

3. The online trimming method for the micro-shell resonator gyroscope according to claim 2, wherein a specific process of step 4 comprises:

step 4.1: the trimming position comprising four uniformly distributed orientation points corresponding to the minimal value of the fitted frequencies, and selecting an edge position of the micro-shell resonator gyroscope corresponding to the above orientation points;

step 4.2: calculating the initial trimming quality, which is:

$$dm_1 = 1/4 \frac{2df_1}{f_{max} + f_{min}} \cdot M_0,$$

wherein $M_0$ is an equivalent mass of the gyroscope; and step 4.3: according to a density and the trimming quality of the micro-shell resonator gyroscope, selecting the diameter of the trimming hole and calculating a trimming depth, and then etching the trimming hole by laser.

4. The online trimming method for the micro-shell resonator gyroscope according to claim 1, wherein the gyroscope fixing fixture comprises a base and a cover assembly;

the base is fixedly arranged in the vacuum test cavity, and a top of the base is provided with a limiting slot configured for receiving the gyroscope substrate;

the cover assembly fixedly covers the base and a top of the gyroscope substrate; the cover plate assembly is provided with a plurality of conducting columns in one-to-one correspondence with the gyroscope electrodes, and bottom ends of the conducting columns are correspondingly connected to the gyroscope electrodes; and the signal interface is arranged on the cover plate assembly and is electrically connected to each of the conducting columns.

5. The online trimming method for the micro-shell resonator gyroscope according to claim 4, wherein the cover assembly comprises a conducting plate and a signal connection plate;

the conducting plate is provided with a first through hole, and the conducting plate covers the base and the top of the gyroscope substrate; the conducting plate is sleeved at an interval on the resonant structure through the first through hole; each of the conducting columns is arranged on the conducting plate;

the signal connection plate is provided with a second through hole and a plurality of bonding pads in one-to-one correspondence with the conducting columns; the signal connection plate covers a top of the conducting plate; the signal connection plate is sleeved at an interval on the resonant structure through the second through hole; the bonding pads are correspondingly connected to top ends of the conducting columns; and the signal interface is arranged on the signal connection board and is electrically connected to each of the bonding pads through wires inside the signal connection board.

6. The online trimming method for the micro-shell resonator gyroscope according to claim 1, wherein the mode test circuit module comprises a signal processing circuit board, a signal input interface, and a signal exchange interface, wherein the signal input interface and the signal exchange interface are arranged on the signal processing circuit board; the signal input interface and the signal exchange interface are communicated with an interior of the signal processing circuit board;

the signal input interface is electrically connected to the signal interface through a first connection line to realize communication between the gyroscope electrodes and the signal processing circuit board; and the signal exchange interface is electrically connected to the circuit interface through a second connection line to realize an external power supply for the mode test circuit module and an interaction of the mode test circuit module with the host computer.

7. The online trimming method for the micro-shell resonator gyroscope according to claim 1, wherein the housing comprises a bottom cover and a top cover;

the top cover is detachably fixed to the bottom cover, and the top cover and the bottom cover define the vacuum test cavity; a side of the bottom cover is provided with an air outlet communicated with the vacuum test cavity to connect an external evacuating device; and the trimming window is arranged at the top cover, and the circuit interface is arranged on a side of the bottom cover.

8. The online trimming method for the micro-shell resonator gyroscope according to claim 2, wherein the gyroscope fixing fixture comprises a base and a cover assembly;

the base is fixedly arranged in the vacuum test cavity, and a top of the base is provided with a limiting slot configured for receiving the gyroscope substrate;

the cover assembly fixedly covers the base and a top of the gyroscope substrate; the cover plate assembly is provided with a plurality of conducting columns in one-to-one correspondence with the gyroscope electrodes, and bottom ends of the conducting columns are correspondingly connected to the gyroscope electrodes; and the signal interface is arranged on the cover plate assembly and is electrically connected to each of the conducting columns.

9. The online trimming method for the micro-shell resonator gyroscope according to claim 3, wherein the gyroscope fixing fixture comprises a base and a cover assembly;

the base is fixedly arranged in the vacuum test cavity, and a top of the base is provided with a limiting slot configured for receiving the gyroscope substrate;

the cover assembly fixedly covers the base and a top of the gyroscope substrate; the cover plate assembly is provided with a plurality of conducting columns in one-to-one correspondence with the gyroscope electrodes, and bottom ends of the conducting columns are correspondingly connected to the gyroscope electrodes; and the signal interface is arranged on the cover plate assembly and is electrically connected to each of the conducting columns.

10. The online trimming method for the micro-shell resonator gyroscope according to claim 2, wherein the mode test circuit module comprises a signal processing circuit board, a signal input interface, and a signal exchange interface, wherein the signal input interface and the signal exchange interface are arranged on the signal processing circuit board; the signal input interface and the signal exchange interface are communicated with an interior of the signal processing circuit board;

the signal input interface is electrically connected to the signal interface through a first connection line to realize communication between the gyroscope electrodes and the signal processing circuit board; and the signal exchange interface is electrically connected to the circuit interface through a second connection line to realize an external power supply for the mode test circuit module and an interaction of the mode test circuit module with a host computer.

11. The online trimming method for the micro-shell resonator gyroscope according to claim 3, wherein the mode test circuit module comprises a signal processing circuit board, a signal input interface, and a signal exchange interface, wherein the signal input interface and the signal exchange interface are arranged on the signal processing circuit board; the signal input interface and the signal exchange interface are communicated with an interior of the signal processing circuit board;

the signal input interface is electrically connected to the signal interface through a first connection line to realize communication between the gyroscope electrodes and the signal processing circuit board; and the signal exchange interface is electrically connected to the circuit interface through a second connection line to realize an external power supply for the mode test circuit module and an interaction of the mode test circuit module with a host computer.

12. The online trimming method for the micro-shell resonator gyroscope according to claim 2, wherein the housing comprises a bottom cover and a top cover;

the top cover is detachably fixed to the bottom cover, and the top cover and the bottom cover define the vacuum test cavity; a side of the bottom cover is provided with an air outlet communicated with the vacuum test cavity to connect an external evacuating device; and the trimming window is arranged at the top cover, and the circuit interface is arranged on a side of the bottom cover.

13. The online trimming method for the micro-shell resonator gyroscope according to claim 3, wherein the housing comprises a bottom cover and a top cover;

the top cover is detachably fixed to the bottom cover, and the top cover and the bottom cover define the vacuum test cavity; a side of the bottom cover is provided with an air outlet communicated with the vacuum test cavity to connect an external evacuating device; and the trimming window is arranged at the top cover, and the circuit interface is arranged on a side of the bottom cover.

\* \* \* \* \*